United States Patent
Moon et al.

(10) Patent No.: US 8,536,877 B2
(45) Date of Patent: Sep. 17, 2013

(54) POWER CABLE BREAKING DETECTION METHOD OF MOTOR

(75) Inventors: Sanghyeon Moon, Gyeonggi-do (KR); Youngkook Lee, Seoul (KR); Jin Hwan Jung, Gyoenggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 288 days.

(21) Appl. No.: 12/953,146

(22) Filed: Nov. 23, 2010

(65) Prior Publication Data

US 2012/0068721 A1 Mar. 22, 2012

(30) Foreign Application Priority Data

Sep. 17, 2010 (KR) ........................ 10-2010-0092053

(51) Int. Cl.
*G01R 31/02* (2006.01)
(52) U.S. Cl.
USPC ...................... 324/543; 324/765.01
(58) Field of Classification Search
USPC ........................................................ 324/543
See application file for complete search history.

(56) References Cited

U.S. PATENT DOCUMENTS

| | | | |
|---|---|---|---|
| 7,233,465 B2 * | 6/2007 | Lee | 361/42 |
| 7,880,417 B2 * | 2/2011 | Suzuki | 318/432 |

FOREIGN PATENT DOCUMENTS

JP 2008141928 A 6/2008

* cited by examiner

*Primary Examiner* — Arleen M Vazquez
*Assistant Examiner* — Feba Pothen
(74) *Attorney, Agent, or Firm* — Edwards Wildman Palmer LLP; Peter F. Corless

(57) ABSTRACT

A power cable breaking detection method for a vehicle includes detecting currents of respective phases supplied to a three-phase motor from an inverter through at least a power cable, and a driving speed of the motor, determining whether the respective currents and the driving speed of the motor satisfy power cable breaking detection conditions, determining whether various conditions are satisfied with respect to a cable breaking sensing reference value of a current command performing cable breaking timer counting when the conditions are satisfied, and determining whether a predetermined period has elapsed such that a cable is considered broken when the predetermined period has elapsed.

3 Claims, 3 Drawing Sheets

POWER CABLE BREAKING DETECTION METHOD OF MOTOR

CROSS-REFERENCE TO RELATED APPLICATION

This application claims priority to and the benefit of Korean Patent Application No. 10-2010-0092053 filed in the Korean Intellectual Property Office on Sep. 17, 2010, the entire contents of which are incorporated herein by reference.

BACKGROUND OF THE INVENTION (a) Field of the Invention

The present invention relates to a power cable breaking detection method for an electric vehicle, a hybrid vehicle, a fuel cell vehicle and the like.

(b) Description of the Related Art

An electric vehicle, a hybrid vehicle, a fuel cell vehicle and so on may use a motor provided with a permanent magnet.

The motor is driven by phase current which is supplied from an inverter through a power cable, where the phase current is converted from DC voltage into 3-phase AC voltage according to a PWM (Pulse Width Modulation) signal of a controller.

If a power cable connecting an inverter and a motor is broken or in short circuit, the motor does not operate sufficiently and also, high voltage and high current may be supplied to the inverter, and thus the entire system may not function properly.

Also, a disconnection/short circuit in the power cable may induce an excessive pulsation torque so as to break elements mechanically connected to the motor.

In the conventional art of power cable breaking detection, a successive switching sequence is supplied to an inverter and each current phase (U, V and W) is detected, each current phase (U, V and W) is analyzed, and a broken cable is detected before driving a motor. As used herein, the terms "current phase" and "phase current" are used interchangeably.

However, a conventional power cable breaking detection method may not detect power cable breaking in driving conditions.

In another conventional power cable breaking detection method, since one phase of current flowing through a broken cable is zero regardless of switching of an inverter, the other 2 current phases may have considerable errors comparing a current command, so errors are detected in order to detect power cable breaking.

However, by using the conventional current control error method, such a method may display a malfunction of current control of an inverter or over current malfunction, and may not detect which phase is malfunctioning, so that it may not be possible to appropriately diagnose and address the malfunction.

The above information disclosed in this Background section is only for enhancement of understanding of the background of the invention and therefore it may contain information that does not form the prior art that is already known in this country to a person of ordinary skill in the art.

SUMMARY OF THE INVENTION

According to one aspect of the present invention, a power cable breaking detection method is provided for an electric vehicle, a hybrid vehicle, a fuel cell vehicle and the like which may detect a power cable breaking so as to enhance durability and reliability.

A power cable breaking detection method according to an exemplary embodiment of the present invention may include at least detecting currents of respective phases supplied to a three-phase motor from an inverter through at least one power cable, and a driving speed of the motor, determining whether the respective currents and the driving speed of the motor satisfy power cable breaking detection conditions, determining whether each of the phase currents is less than a cable breaking sensing reference value of a current command, a sum of the three phase currents is more than the cable breaking sensing reference value of the current command, and two of the three phase currents except for a cable breaking phase current is more than the cable breaking sensing reference value of the current command when the respective currents and the driving speed of the motor satisfy power cable breaking detection conditions, performing cable breaking timer counting when the above conditions are satisfied, and determining whether a predetermined period has elapsed, and if the predetermined time has elapsed, determining that a cable is broken.

The power cable breaking detection conditions described above may be satisfied if the driving speed of the motor is more than a predetermined standard speed, and the current command supplied to the motor is more than a detecting current command.

It may be determined that the at least one cable connecting the motor and the inverter is not broken if any one of the above conditions is not satisfied.

The power cable breaking detection method according to an exemplary embodiment of the present invention may detect a power cable breaking so as to prevent catastrophic damage in early stages.

The power cable breaking detection method according to an exemplary embodiment of the present invention may detect which phase has malfunctioned so that an effective plan for dealing with the malfunction may be realized.

DETAILED DESCRIPTION OF PREFERRED EMBODIMENTS

Figure 1:
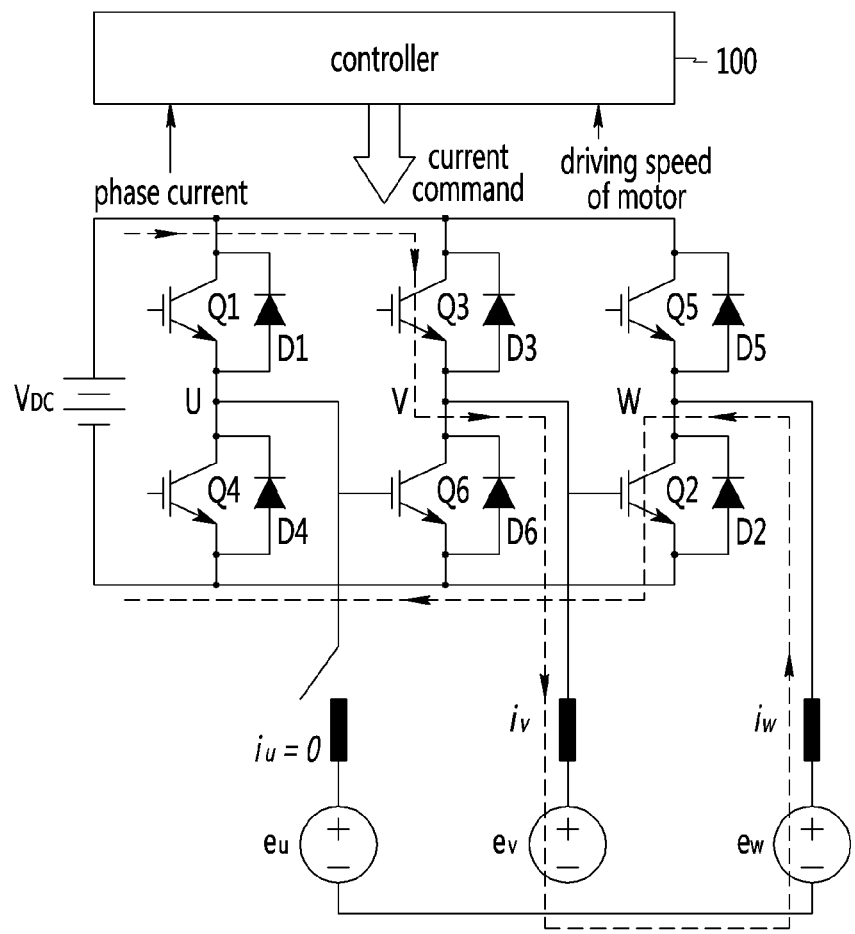
FIG. 1 is a schematic diagram of a current path of an inverter system in the event of a cable breaking of U phase, according to a first switching arrangement.

Hereinafter, referring to the drawings, exemplary embodiments of the present invention will be described in detail.

As those skilled in the art would realize, the described embodiments may be modified in various different ways, all without departing from the spirit or scope of the present invention. Description of components that are not necessary for explaining the present invention will be omitted, and the same constituent elements are denoted by the same reference numerals in this specification.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

FIG. 1 is a schematic diagram of a current path of an inverter system in the event of a cable breaking of U phase according to a first switching arrangement.

As shown in FIG. 1, for example, if a power cable of U phase connecting a motor and an inverter is broken, and a V phase upper arm Q3 and a W phase lower arm Q2 of IGBT switching elements forming the inverter are switched on, then a closed current loop of DC link Vdc→V phase upper arm Q3→motor V phase ev→motor W phase ew→W phase lower arm Q2→DC link Vdc is formed.

Figure 2:
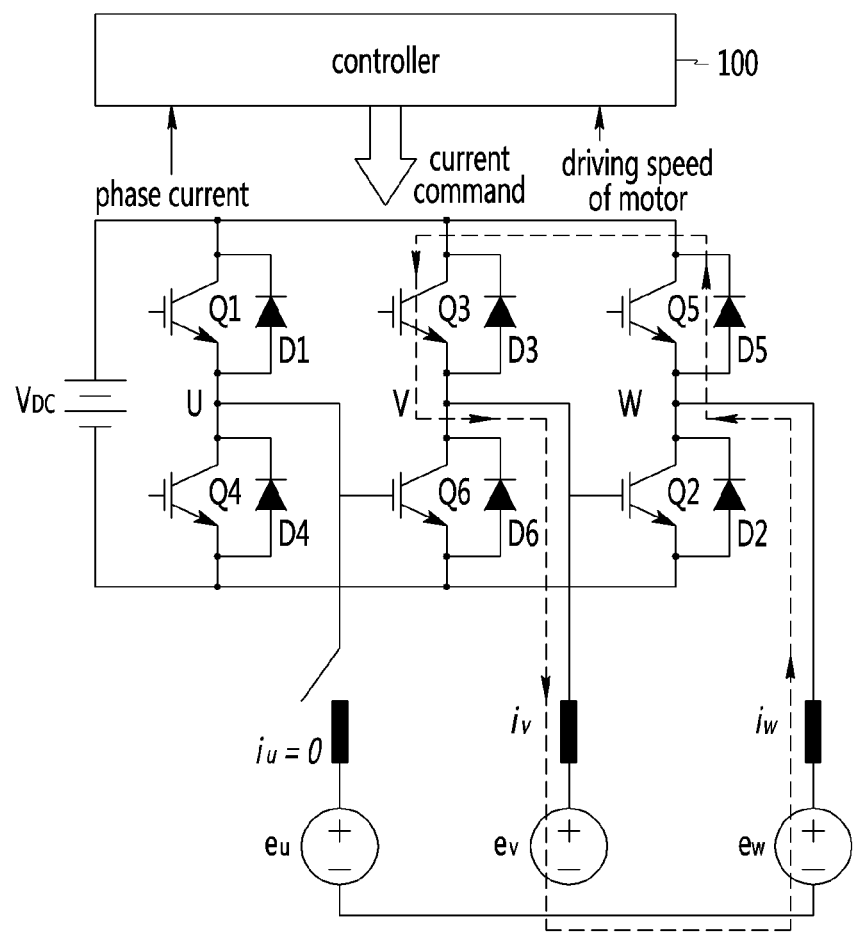
FIG. 2 is a schematic diagram of a current path of an inverter system in the event of a cable breaking of U phase, according to a second switching arrangement.

FIG. 2 is a schematic diagram of a current path of an inverter system in the event of a cable breaking of U phase according to a second switching arrangement.

As shown in FIG. 2, for example, if the power cable of U phase connecting the motor and the inverter is broken, and the V phase upper arm Q3 and a W phase upper arm Q5 of the IGBT switching elements forming the inverter are switched on, then a closed current loop of motor W phase ew→W phase upper arm Q5→V phase upper arm Q3→motor V phase ev is formed.

As shown in FIG. 1 and FIG. 2, if the cable of U phase connecting the inverter and the motor is broken, a 3-phase Y-connection circuit motor satisfies the following equations.

$$iu+iv+iw=0$$

$$iu=0$$

$$iv=-iw \quad \text{Equations}$$

As shown in the above equations, a sum of the three phases of current is zero, a broken phase current is zero, and thus each of two phases of current, which are not broken, has the same value but with different signs. And thus, the power cable breaking detection method of the present exemplary invention can detect power cable breaking according to the above equations.

Figure 3:
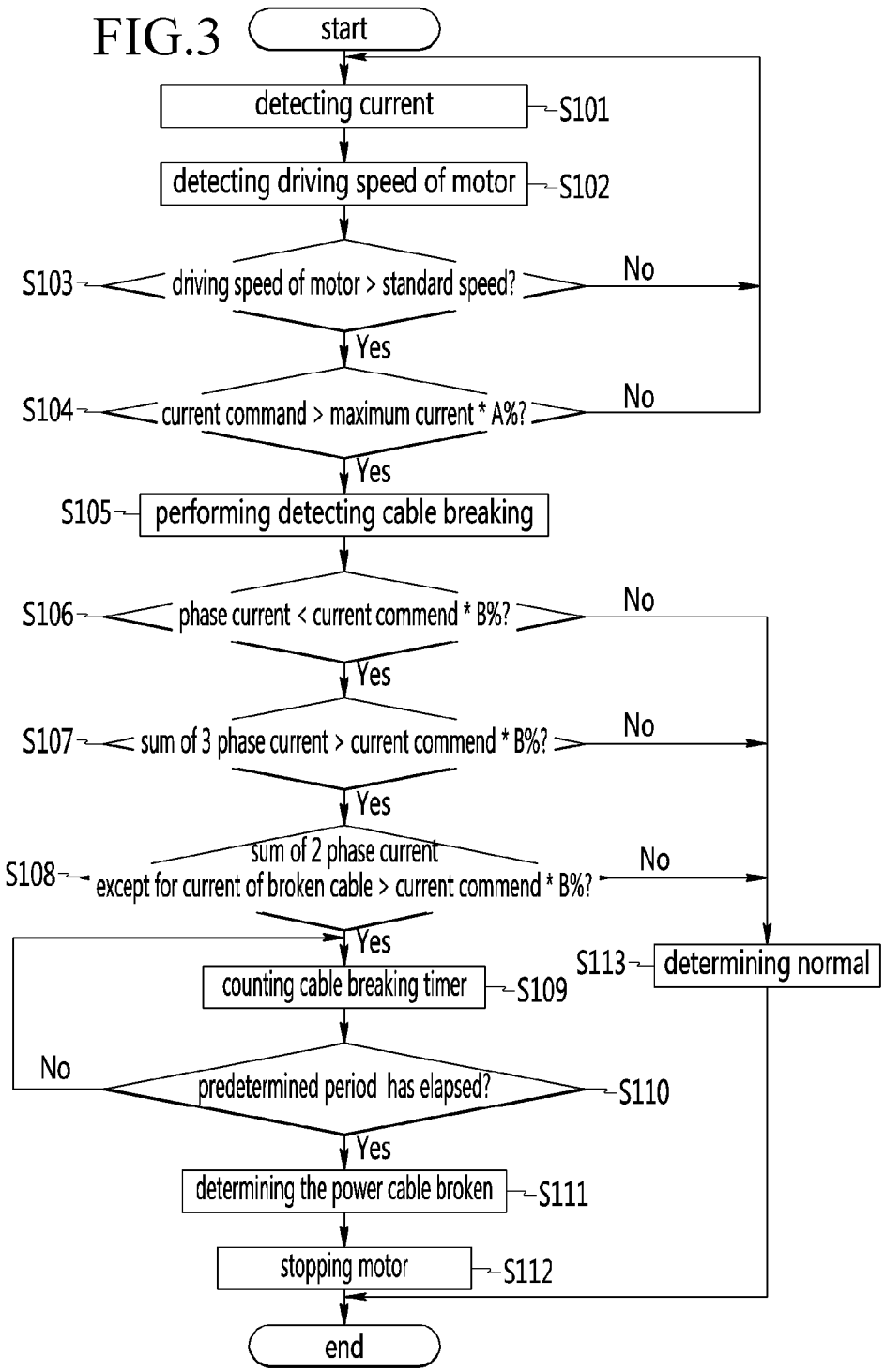
FIG. 3 is a flowchart of a power cable breaking detection method according to an exemplary embodiment of the present invention.

FIG. 3 is a flowchart of a power cable breaking detection method according to an exemplary embodiment of the present invention.

A controller 100 outputs current commands to each current of the inverter as the PWM signal, and then the IGBT switching elements are switched according to the current command so as to supply each of the phase currents to the motor to drive.

Simultaneously the controller 100 detects each of the currents supplied to the motor according to switching of the inverter (S101).

Since rotation speed of a motor depends on frequency, if frequency of a motor is zero or low, it results that one phase current may be held zero or near zero according to positions of a rotor. And thus, a predetermined standard speed can be determined for preventing misdetection of cable breaking.

The controller 100 detects driving speed of the motor (S102), and then determines whether the driving speed of the motor is more than the predetermined standard speed (S103). The driving speed of the motor is calculated as frequency of a motor multiples by 60/pole.

If it is determined that the driving speed of the motor is not more than the predetermined standard speed in the step S103, it is returned to the step S101.

However, if the driving speed of the motor is more than the predetermined standard speed in the step S103, it is determined that the current command supplied to the motor is more than a detecting current command (S104). The detecting current command may be determined considering rectifying control of a motor, effect of noise and so on, for example A % (10%) of a maximum current, where the maximum current means the maximum current which is capable of flowing in each motor.

If it is determined that the current command supplied to the motor is more than the detecting current command, for example A % (10%) of the maximum current in the step S104, then a step of detecting cable breaking of the cable connecting the motor and the inverter is performed (S105).

Subsequently, it is determined whether the phase current supplied to the motor is less than a cable breaking sensing reference value of the current command (S106). In this stage, the cable breaking sensing reference value of the current command may be determined considering the effects of noise, control malfunction and so on, for example B % (50%) of the current command.

In the step S106, if it is determined that the phase current supplied to the motor is not less than the cable breaking sensing reference value of the current command, for example B % (50%) of the current command, then it is determined that the cable connecting the inverter and the motor is normal (S113).

However, if it is determined that the phase current supplied to the motor is less than the cable breaking sensing reference value of the current command, for example B % (50%) of the current command in the step S106, then it is determined that whether sum of the three phase currents is more than the cable breaking sensing reference value of the current command (S107).

If it is determined that the sum of three phase currents is not more than the cable breaking sensing reference value of the current command in the step S107, then it is determined that the cable connecting the inverter and the motor is normal (S113).

If it is determined that the sum of three phase currents is more than the cable breaking sensing reference value of the current command in the step S107, then it is determined whether two of the three phase currents, except for the cable breaking phase current, is more than the cable breaking sensing reference value of the current command, for example B % (50%) of the current command (S108).

If it is determined that the two phase currents except for the cable breaking phase current is not more than the cable breaking sensing reference value of the current command, for example B % (50%) of the current command in the step S 108, then it is determined that the cable connecting the inverter and the motor is normal (S113).

If it is determined that the two phase currents except for the cable breaking phase current is more than the cable breaking sensing reference value of the current command, then cable breaking timer counting is performed (S109).

If it is determined that a predetermined period has elapsed in a step S110, then it is determined that the cable connecting the inverter and the motor is broken (S111). And then, the motor is controlled to stop for preventing breaking of the inverter system due to power cable breaking (S112).

For example, if just two of the three phase currents supplied from an inverter to a motor are detected, and a power cable of which one of the two phase current flows is broken, then the power cable breaking detection method may be performed as follows.

Since the current which flows the broken cable is detected as zero, and the normal currents may be determined using the relationship that the sum of the three phases is zero, so that the current, which is detected, and the other current, which is not detected, are determined as having the same amount value, but opposite signs.

And thus, if the above relationship of the current continues 3 or 4 times according to the breaking timer counting, the power cable of which the detected current is zero is determined as broken.

For example, if just two phase currents supplied from an inverter to a motor are detected, and a power cable, which is not detected, is broken, the power cable breaking detection method may be performed as follows.

The detected currents have the same amount value, but opposite signs, and undetected current may be determined using the relationship that the sum of the three phases is zero. And thus, if the above relationship of the current continues 3 or 4 times according to the breaking timer counting, it is determined that the power cable of which the undetected current flows is broken.

For example, if all of three phase currents supplied from an inverter to a motor are detected, and a power cable of which one of the three phase current flows is broken, the power cable breaking detection method may be performed as follows.

The current which flows the broken cable is detected as zero, and the other normal currents is detected as having the same amount value, but opposite signs. And thus, if the above relationship of the current continues 3 or 4 times according to the breaking timer counting, the power cable of which the detected current is zero is determined as broken.

Using the relationship described above, if the U phase current is detected as zero, the other V phase and the W phase are detected as having the same value, but opposite signs, then it is determined that the power cable connecting the inverter and the motor is broken, and the broken cable is the U phase.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A power cable breaking detection method comprising:
   (a) detecting currents of respective phases supplied to a three-phase motor from an inverter through at least one power cable, and a driving speed of the motor;
   (a1) supplying a current command to the motor;
   (b) determining whether the respective currents and the driving speed of the motor satisfy power cable breaking detection conditions by determining whether the current command supplied to the motor is more than 10% of a maximum current;
   (c) determining whether each of the phase currents is less than a cable breaking sensing reference value of current command, a sum of the three phase currents is more than 50% of the current command, and two of the three phase currents except for a cable breaking phase current is more than the cable breaking sensing reference value of 50% of the current command when the respective currents and the driving speed of the motor satisfy the power cable breaking detection conditions;
   (d) performing cable breaking timer counting when conditions of the step (c) are satisfied, and determining whether a predetermined period has elapsed; and
   (e) determining that a cable is broken when the predetermined period has elapsed.

2. The method of claim 1, wherein the power cable breaking detection conditions of the step (c) are satisfied when the driving speed of the motor is greater than a predetermined standard speed, and the current command supplied to the motor is greater than a detecting current command.

3. The method of claim 1, wherein it is determined that the cables connecting the motor and the inverter is not broken if any one of the conditions of the step (c) is not satisfied.

* * * * *